United States Patent [19]
Gal et al.

[11] Patent Number: 5,214,299
[45] Date of Patent: May 25, 1993

[54] FAST CHANGE STANDARD CELL DIGITAL LOGIC CHIP

[75] Inventors: Laszlo V. Gal, Poway; David W. Waite, Carlsbad; Jonathan A. Levi, Fallbrook, all of Calif.

[73] Assignee: Unisys Corporation, Blue Bell, Pa.

[21] Appl. No.: 411,434

[22] Filed: Sep. 22, 1989

[51] Int. Cl.$^5$ .......................................... H01L 27/02
[52] U.S. Cl. ................................. 257/208; 257/204
[58] Field of Search ............................................ 357/41

[56] References Cited

U.S. PATENT DOCUMENTS

| | | | |
|---|---|---|---|
| 4,161,662 | 7/1979 | Malcolm et al. | 357/41 |
| 4,412,237 | 10/1983 | Matsumura et al. | 357/41 |
| 4,562,453 | 12/1985 | Noguchi et al. | 357/4 |
| 4,668,972 | 5/1987 | Sato et al. | 357/41 |
| 4,692,783 | 9/1987 | Monma et al. | 357/41 |
| 4,694,187 | 2/1987 | Haji | 357/41 |
| 4,742,383 | 5/1988 | Fitzgerald | 357/41 |
| 4,771,327 | 9/1988 | Usui | 357/41 |

Primary Examiner—Andrew J. James
Assistant Examiner—D. Monin
Attorney, Agent, or Firm—Charles J. Fassbender; Mark T. Starr

[57] ABSTRACT

An improved standard cell logic chip, of the type which contains one to fifteen thousand standard logic cells that are disposed in rows on a substrate, and has cell interconnect channels of different widths between the rows, also includes fast change logic cells which are sparsely distributed in the rows of standard logic cells. Each fast change cell selectively performs any one of several logic functions. These fast change logic cells are formed from the same stacked conductive and insulative layers as the standard logic cells; however, in the fast change cells, all conductive and insulative layers which are below at least the mid level in the stack of layers have respective patterns which are identical in every fast change cell. Only the remaining conductive and insulative layers in the fast change cells have respective patterns which differ from one fast change cell to another, and they select the logical functions which the fast change cells perform.

11 Claims, 8 Drawing Sheets

FAST CHANGE STANDARD CELL DIGITAL LOGIC CHIP

BACKGROUND OF THE INVENTION

This invention relates to standard cell digital logic chips; and more particularly, it relates to an improvement to such chips which enables minor logic changes to be made in a much quicker and less expensive fashion than has heretofore been possible.

Conventionally, a standard cell digital logic chip contains one to fifteen thousand standard logic cells which are arranged in rows on a semiconductor substrate. Cell interconnect channels of various widths lie between the rows. All of the standard logic cells that are on the chip are chosen by a chip designer from a library of at least 100 different types of cells, and each cell type in the library performs a different logic function. For example, one type of standard logic cell performs a five-input NAND function; another type of standard logic cell performs a three-input OR function, etc. Standard cells of a type that are commonly referred to as super-cells or megacells can also be in the library, and they include read/write memory arrays, read-only memory arrays, multiplier cells, and input/output buffers.

Each type of standard cell is made up of a respective number of transistors, and the number of transistors that are in a particular cell is the minimum number which is needed to perform the cell's logic function. This minimizing of the number of transistors per cell reduces the amount of chip space which the cell occupies, and thereby increases the total number of cells that can be put on a single chip. Also in each type of standard logic cell, the placement, the size, and the interconnections of the transistors are customized in order to further reduce the chip space which the cell occupies.

All of the transistors within a cell, as well as their placement and interconnection, are formed by several patterned conductive and insulative layers which are integrated together in a stack. Thus, to reduce the size of a cell as explained above, the shape of each of these layers must be customized. Consequently, each layer of every cell in the cell library has a unique and irregularly shaped pattern.

Such reduction in the size of the standard cells is a very important consideration because it enables a multichip product to be built with fewer chips, and that in turn enables the price of the product to be proportionately reduced. However, the present inventors have discovered that even when the size of every cell in the cell library is the smallest that is commercially available, the chips that are made from those cells still have a major deficiency. This deficiency relates to the speed at which logic errors on a chip can be fixed, and this deficiency can be so serious that it can actually determine the success or failure in the marketplace of a product which is made from the standard cell logic chips.

Accordingly, a primary object of the invention is to provide an improved standard cell logic chip in which the above deficiency, which is described fully in the Detailed Description, is corrected.

BRIEF SUMMARY OF THE INVENTION

An improved standard cell logic chip includes one to fifteen thousand standard logic cells that are disposed in rows on a substrate, and cell interconnect channels of different widths lie between the rows. -Each standard logic cell consists of multiple conductive and insulative layers which are integrated together in a stack; and, each of those layers have respective irregular shaped patterns which differ from one standard logic cell to another based on a logic function which the standard logic cell performs.

Further, in accordance with the present invention, the improvement comprises several fast change logic cells which are sparsely distributed in the rows of standard logic cells. Each fast change cell selectively performs any one of several logic functions. These fast change logic cells are formed from the same stacked layers as the standard logic cells; however, in the fast change cells, all conductive and insulative layers which are below at least the midlevel in the stack of layers have respective patterns which are identical in every fast change cell. Only the remaining conductive and insulative layers in the fast change cells have respective patterns which differ from one fast change cell to another, and they select the logical functions which the fast change cells perform.

BRIEF DESCRIPTION OF THE DRAWINGS

Various features and advantages of the invention are described in the Detailed Description in conjunction with the accompanying drawings wherein.

DETAILED DESCRIPTION OF THE INVENTION

Figure 1:
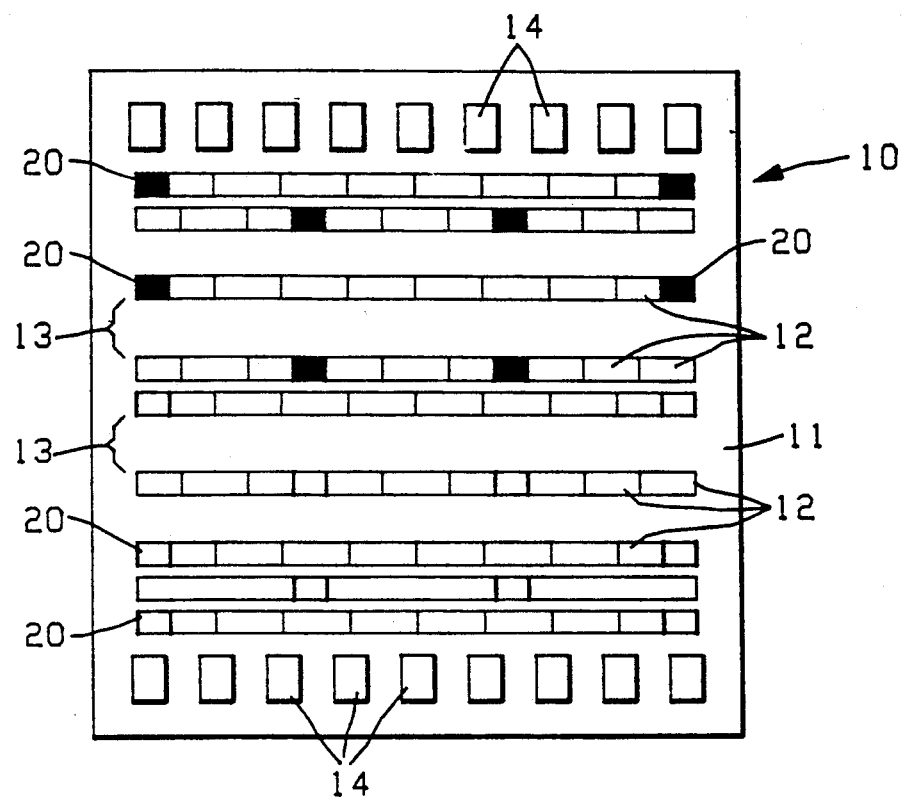
FIG. 1 shows an overview of an improved standard cell digital logic chip which includes thousands of standard logic cells and a much smaller number of sparsely distributed fast change logic cells.

Referring now to FIG. 1, a preferred embodiment of an integrated circuit chip 10 that is constructed according to the invention will be described in detail. This embodiment includes a semiconductor substrate 11 on which one thousand to fifteen thousand standard logic cells 12 are disposed in spaced apart rows. These standard logic cells are chosen by a chip designer from a library of one hundred to five hundred different types of standard cells, each of which performs one particular predetermined logic function. For example, one type of standard logic cell performs a five input NAND function; another type of standard logic cell performs a three input OR function; etc.

Also included on the substrate 11 between the rows of standard logic cells 12 are routing channels 13. Each routing channel 13 contains microscopic interconnections (not shown) between the standard logic cells 12, and the width of each channel 13 depends upon the number of interconnections that it carries. Some interconnections are also routed to bonding pads 14, which are terminals for sending signals to and receiving signals from the standard logic cells.

Now in accordance with the present invention, the chip 10 further includes fast change logic cells 20 which are sparsely distributed in the rows with the standard logic cells 12. Preferably, these fast change logic cells number less than 5% times the total number of standard logic cells. Each fast change logic cell selectively performs any one of several logic functions; and, the selection of which particular function is performed can be physically implemented very quickly in comparison to the time that it takes to physically implement any of the standard logic cells 12.

Figure 2:
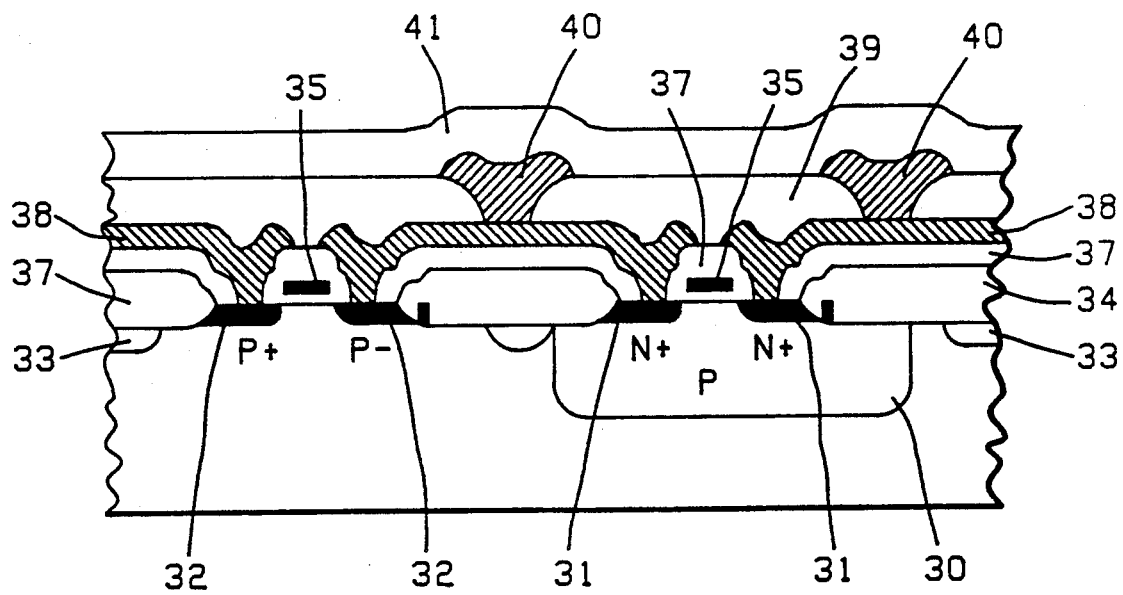
FIG. 2 is a greatly enlarged sectional view through a portion of the FIG. 1 chip which shows all of the patterned conductive and insulative layers that make up the chip's standard logic cells and fast change logic cells.

All of the fast change logic cells 20, as well as all of the standard logic cells 12, are made of various patterned layers 30–41 as are shown in FIG. 2. Layer 30 forms P doped well regions in substrate 11, and one such region exists for each N-channel transistor in the cells 20 and 12. Layer 31 forms N+doped source and drain regions for all N-channel transistors. Layer 32 forms P+ doped source and drain regions for all P-channel transistors. Layer 33 forms P+ doped channel stop regions which surround each transistor. Layer 34 is an oxide insulating layer which overlies the channel stop regions 33. Layer 35 is polysilicon which forms the gate of each N-channel and P-channel transistor. Layer 36 is an insulating layer which underlies each transistor's gate. Layer 37 is another insulating layer which overlies each transistor's gates. Layer 38 is a first metal layer which selectively interconnects the source and drain regions of the transistors. Layer 39 is an insulating layer over the metal layer 37. Layer 40 is a second metal layer which further interconnects the first metal layer 37. And layer 41 is another insulating layer which overlies the second layer metal.

When chip 10 is fabricated, all of the layers 30–41 are formed and patterned by a sequence of steps as is given by TABLE 1 below.

TABLE 1

| | |
|---|---|
| S1. | Oxidize substrate surface. |
| S2. | Deposit nitride layer on oxide. |
| S3. | Deposit photoresist on nitride. |
| S4. | Use mask #1 to pattern photoresist for P-well. |
| S5. | Etch nitride over P-well. |
| S6. | Implant P-well. |
| S7. | Strip nitride. |
| S8. | Deposit new nitride layer. |
| S9. | Deposit photoresist on nitride. |
| S10. | Use mask #2 to pattern photoresist for transistor channel stops. |
| S11. | Etch nitride over channel stops. |
| S12. | Implant channel stops. |
| S13. | Grow field oxide over channel stop implant. |
| S14. | Strip nitride. |
| S15. | Grow gate oxide layer. |
| S16. | Implant to adjust transistor threshold voltage. |
| S17. | Deposit polysilicon layer. |
| S18. | Deposit photoresist on polysilicon. |
| S19. | Use mask #3 to pattern photoresist for transistor gates and poly interconnections. |
| S20. | Etch polysilicon. |
| S21. | Deposit another photoresist layer. |
| S22. | Use mask #4 to pattern resist for source and drain of P-channel transistors. |
| S23. | Implant source and drain of P-channel transistors. |
| S24. | Deposit another photoresist layer. |
| S25. | Use mask #5 to pattern resist for source and drain of N-channel transistors. |
| S26. | Implant source and drain of N-channel transistors. |
| S27. | Grow oxide layer. |
| S28. | Deposit another photoresist layer. |
| S29. | Use mask #6 to pattern resist which defines contact holes to source, drain, and gate. |
| S30. | Etch oxide to make contact holes to source, drain, gate. |
| S31. | Deposit first metal layer. |
| S32. | Deposit another photoresist layer. |
| S33. | Use mask #7 to pattern resist for etching first layer metal. |
| S34. | Etch first metal layer to make patterned conductors and interconnections. |
| S35. | Grow an oxide layer. |
| S36. | Deposit another photoresist layer. |
| S37. | Use mask #8 to pattern resist which defines contact holes to first layer metal. |
| S38. | Etch oxide to make contact holes to first layer metal. |
| S39. | Deposit second layer metal. |
| S40. | Deposit another photoresist layer. |
| S41. | Use mask #9 to pattern resist for etching second layer metal. |
| S42. | Etch second layer metal to make patterned conductors and interconnections. |
| S43. | Grow passivation layer. |

Inspection of TABLE 1 shows that nine masks are used to pattern the various layers in FIG. 2. All of the layers in the standard logic cells have respective patterns which differ for each type of standard logic cell. These different patterns are designed such that they minimize the number of transistors and optimize their placement in each type of standard logic cell, based on the particular function which the cell performs, in order to make the cell very compact. Such compaction is needed because to perform large and complex logic functions on a single chip takes thousands of standard logic cells.

By comparison, all conductive layers and insulating layers in the fast change cells that lie below the first metal layer 38 have respective patterns which are identical in every fast change cell. These lower layers define a fixed number of transistors in each fast change cell as well as a fixed placement and size for those transistors, regardless of the function which those cells perform. In the fast change cells, only the first metal layer 38 and the remaining layers which lie above it have respective patterns which differ from cell to cell. These upper layers select the logical functions which the fast change cells perform by selectively interconnecting the cell's transistors.

This distinction between the structure of the fast change cells and the structure of the standard cells becomes very significant when the fabrication steps S1 thru S43 are carried out in a sequence which will now be described, during the checkout phase of a new digital logic product that is built from the chips 10. Specifically, when a first prototype of the new product is being built, enough chips to build that prototype plus one or more extra prototypes should be processed together in a single boat from step S1 thru step 31. After step 31 is complete, only those wafers which are needed to construct the first prototype are processed by the remaining steps S32–S43. Thereafter, if minor logic errors are found during the checkout of the first prototype, a second prototype which corrects those errors can be quickly built by completing steps S32–S43 on the wafers that were previously processed through step S31. Similarly, if additional logic errors are found in the second prototype, a third prototype can be quickly built from the preprocessed wafers to correct those errors; etc.

Each time a new prototype is constructed by performing just steps S32–S43 instead of all of the steps S1–S43, the time that is saved is about four weeks. Performing all of the steps S1–S43 takes about six weeks, whereas performing just steps S32–S43 takes only about two weeks. This time savings is extremely important during the checkout phase of a new product since the price of practically all digital logic products is cut as time progresses in order to meet new competition. Early entrance of a digital logic product into the marketplace is critical to the success or failure of the product. Hundreds of instances of this marketplace phenomena exist, and two specific recently reported examples are given below in Table 2.

Also, to implement a logic change by performing the process steps S32–S43, only three masks (masks #7, #8, and #9) need to be modified. This compares to the nine masks that would have to be modified if the logic change were implemented by standard logic cells. Typically, to change a mask costs about $1500.00, and this represents an overhead cost that makes the product less competitive in the marketplace.

TABLE 2

Electronic News, April 10, 1989, page 20
IBM 10 MHz PS/2 Model 50Z with 30 MB disk
price cut from $3,995 to $3,250
IBM 10 MHz PS/2 Model 50Z with 60 MB disk
price cut from $4,595 to $3,650
IBM 16 MHz PS/2 Model 70E61 with 60 MB disk
price cut from $5,995 to $5,495
Electronic News, April 10, 1989, page 20
Compaq Deskpro Model 40
price cut from $5,199 to $4,999 in Feb. of '89
price cut from $4,999 to $4,199 in April of '89
Compaq Deskpro Model 20
price cut from $4,499 to $4,299 in Feb. of '89
price cut from $4,299 to $3,799 in April of '89

Figure 3:
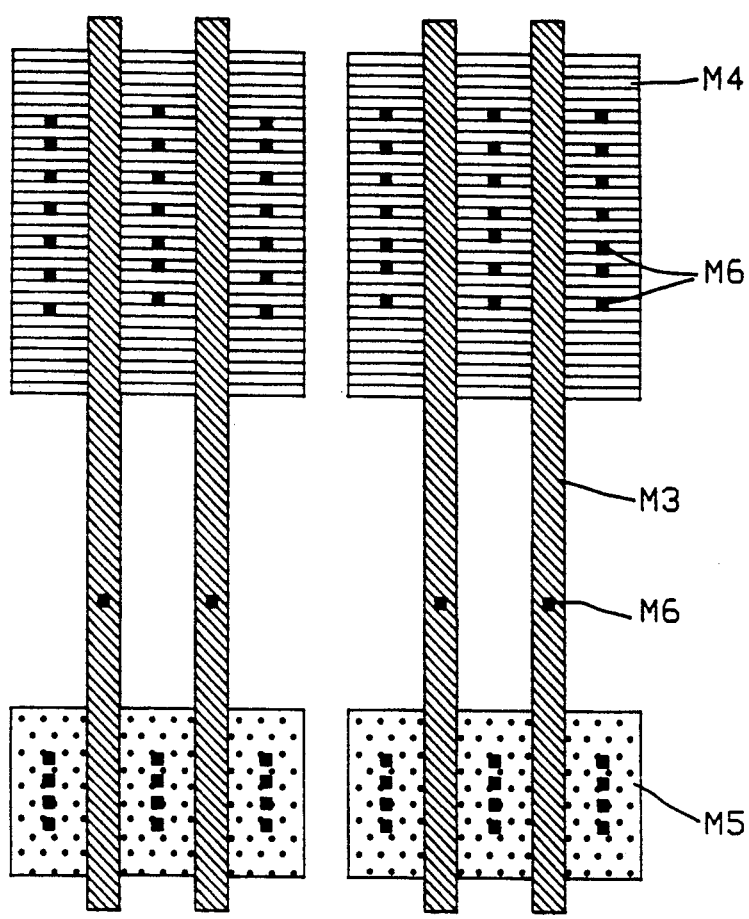
FIG. 3 shows several masks which give a fixed shape to the lower layers of the fast change logic cells.

Turning now to FIG. 3, it shows several masks which define the shape of corresponding lower layers in the fast change logic cells. Reference numeral M3 indicates mask #3 as given in TABLE 1, and it patterns the polysilicon layer 35 in FIG. 2. Reference numeral M4 indicates mask #4 as used in TABLE 1, and it patterns the P-channel source and drain regions 32 as shown in FIG. 2. Reference numeral M5 indicates mask #5 as used in TABLE 1, and it patterns the N-channel transistor source and drain indicates mask #6 as used in TABLE 1, and it patterns the via holes for contacts to the source, gate, and drain regions.

Figure 4:
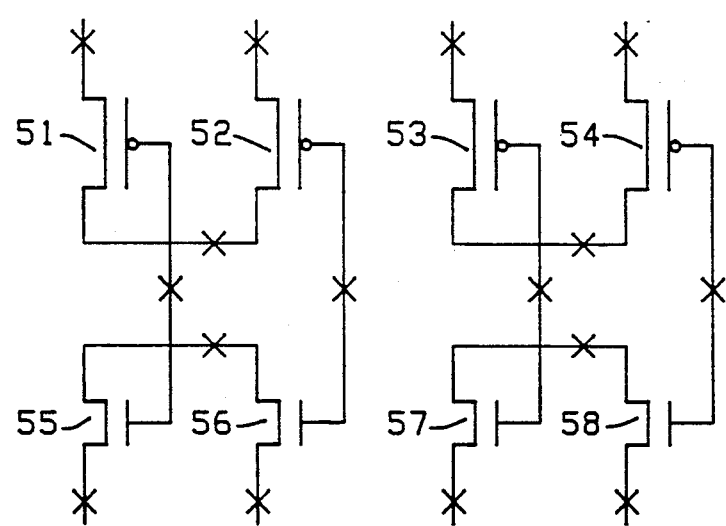
FIG. 4 shows the transistors and their interconnections which are defined by the masks of FIG. 3.

These masks M3–M6 form four P-channel transistors 51–54 and four N-channel transistors 55–58 in each fast change logic cell as is shown in FIG. 4. Each of the transistor pairs 51 and 52, 53 and 54, 55 and 56, and 57 and 58 are connected in series by source-drain regions. Also, each of the transistor pairs 51 and 55, 52 and 56, 53 and 57, and 54 and 58 have a common gate. Contact to these transistors is selectively made by the metal layer 38 at the points indicated in FIG. 4 by an X.

Figure 5B:
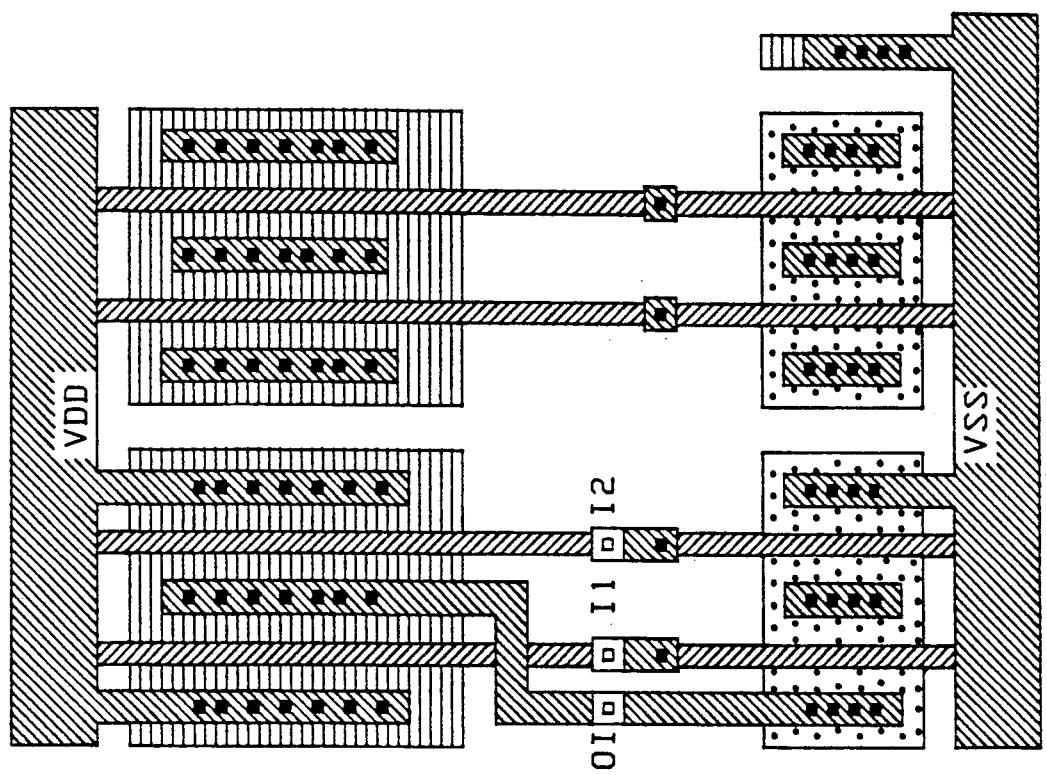
FIG. 5B is a composite drawing in which the masks of FIG. 5A are superimposed on the masks of FIG. 3.
Figure 5A:
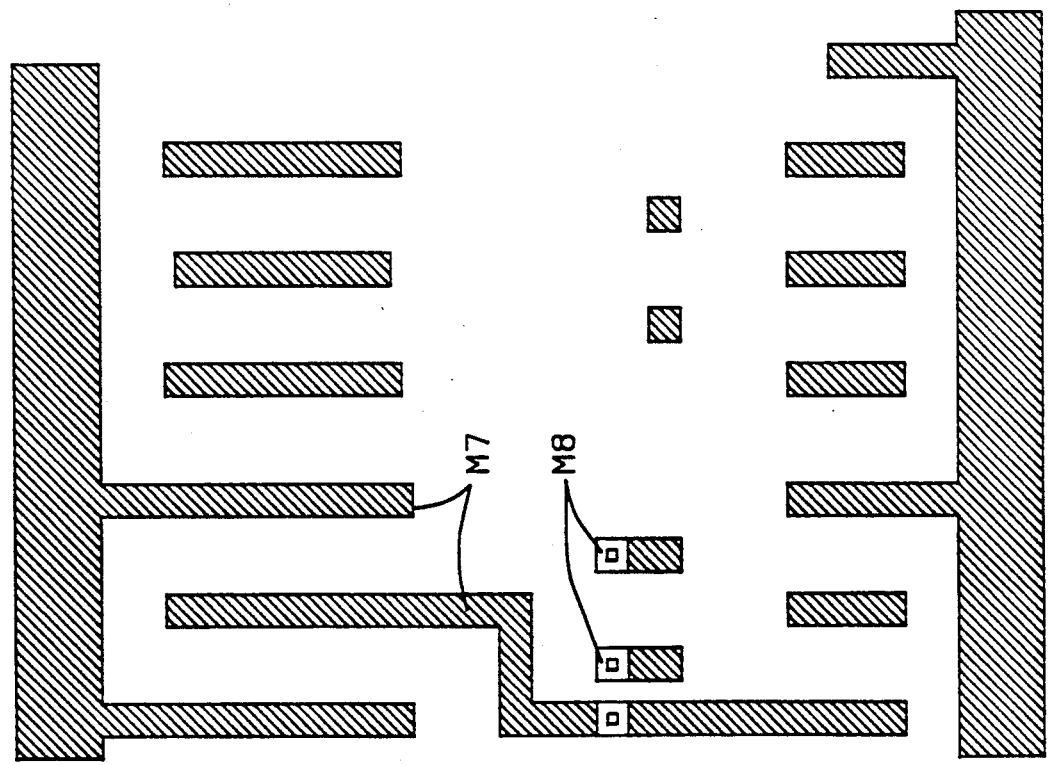
FIG. 5A shows a set of masks for the upper layers of one fast change logic cell which cause the cell to perform a two-input NAND function.

All of the remaining FIGS. 5A, 5B, 6A, 6B, 7, 8, 9, and 10 show some of the ways in which the FIG. 5 transistors can be interconnected to perform different logic functions. For example, FIGS. 5A and 5B show the interconnections which cause the fast change logic cell to perform a two-input NAND function. In FIG. 5A, reference numeral M7 indicates the shape of mask #7 as used in TABLE 1, and it defines the shape of the first layer metal 38 in FIG. 2. Also in FIG. 5A, reference numeral M8 indicates the shape of mask #8 as used in TABLE 1, and it defines the shape and location of the contacts by the second layer metal 39 to the first layer metal 38. Superimposing the mask patterns of FIG. 5A on top of the mask patterns of FIG. 3 yields the two-input NAND gate of FIG. 5B. There the symbols I1 and I2 indicate the gate's inputs, and the symbol O1 indicates the gate's output.

Figure 6B:
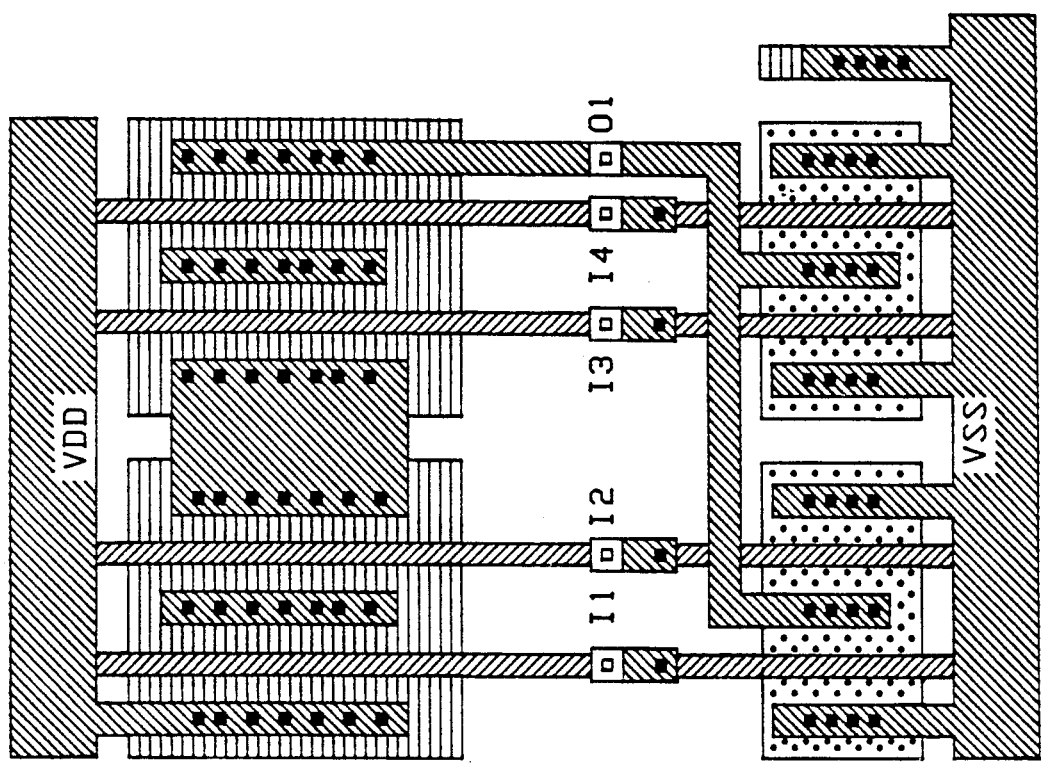
FIG. 6B is a composite drawing in which the masks of FIG. 6A are superimposed on the masks of FIG. 3.
Figure 6A:
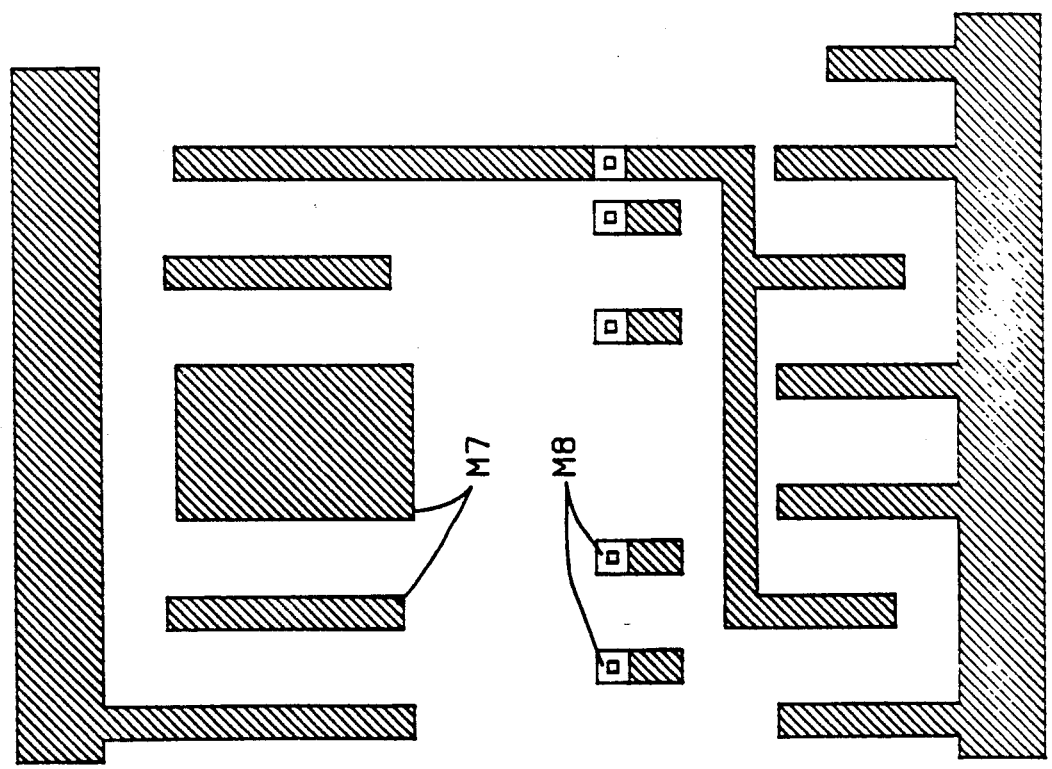
FIG. 6A shows a set of masks for the upper layers of one fast change logic cell which cause the cell to perform a four-input NOR function.

Similarly, FIG. 6A shows the shape for masks #7 and #8 which when used in conjunction with the masks of FIG. 3 make a fast change logic cell that performs a four-input NOR function. Superimposing the masks of FIG. 6A on the masks of FIG. 3 yields the four-input NOR gate of FIG. 6B. There, the symbols I1, I2, I3, and I4 indicate the location of the gate's inputs, and symbol O1 indicates the gate's output.

Figure 8:
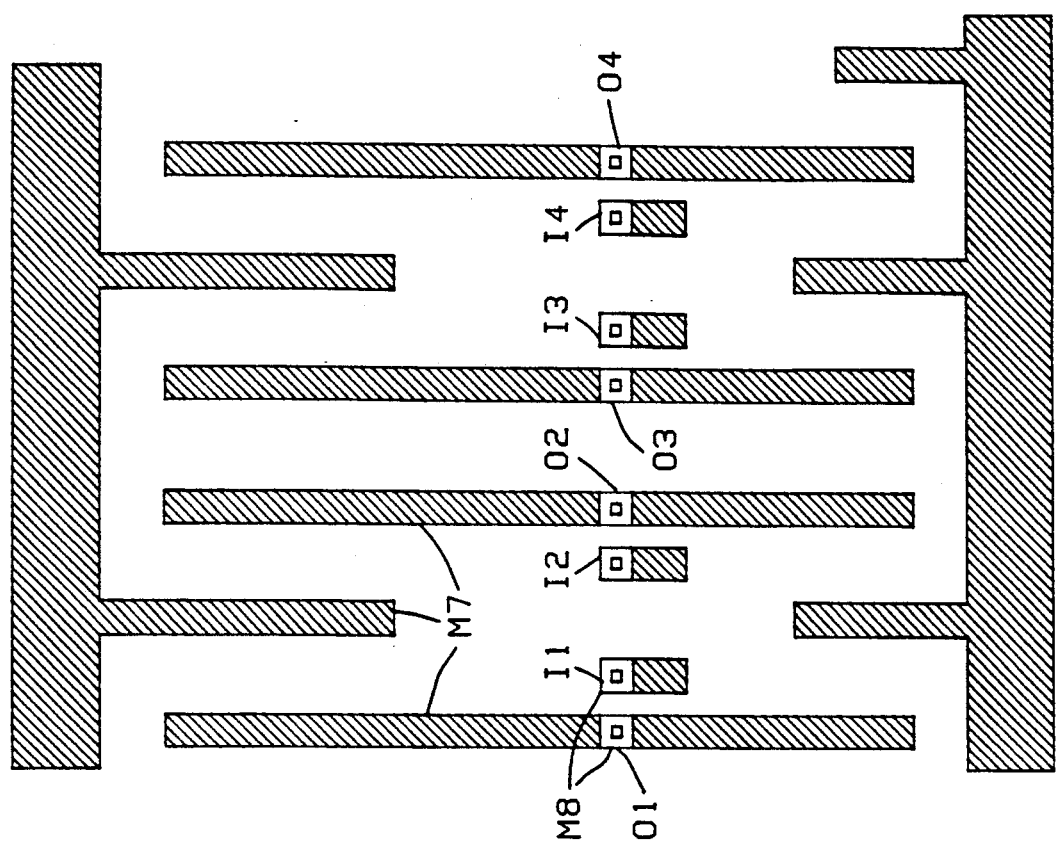
FIG. 8 shows a set of masks for the upper layers of one fast change logic cell which cause the cell to perform four separate inverting functions.
Figure 7:
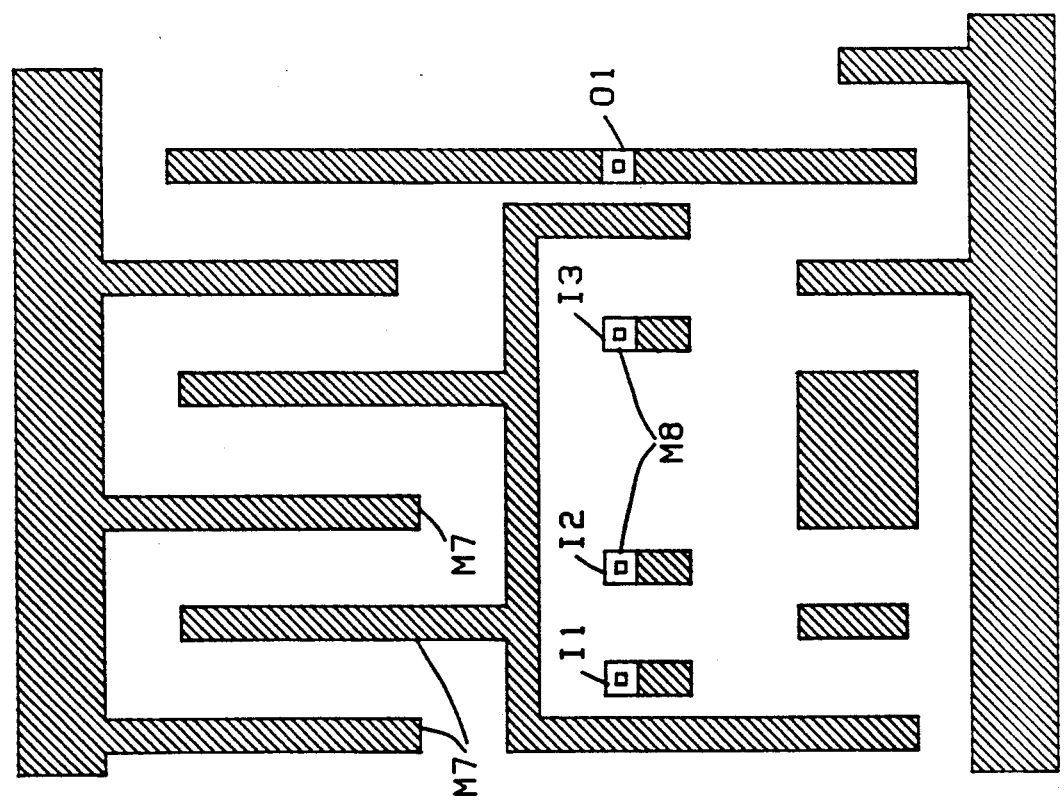
FIG. 7 shows a set of masks for the upper layers of one fast change logic cell which cause the cell to perform a three-input AND function.
Figure 10:
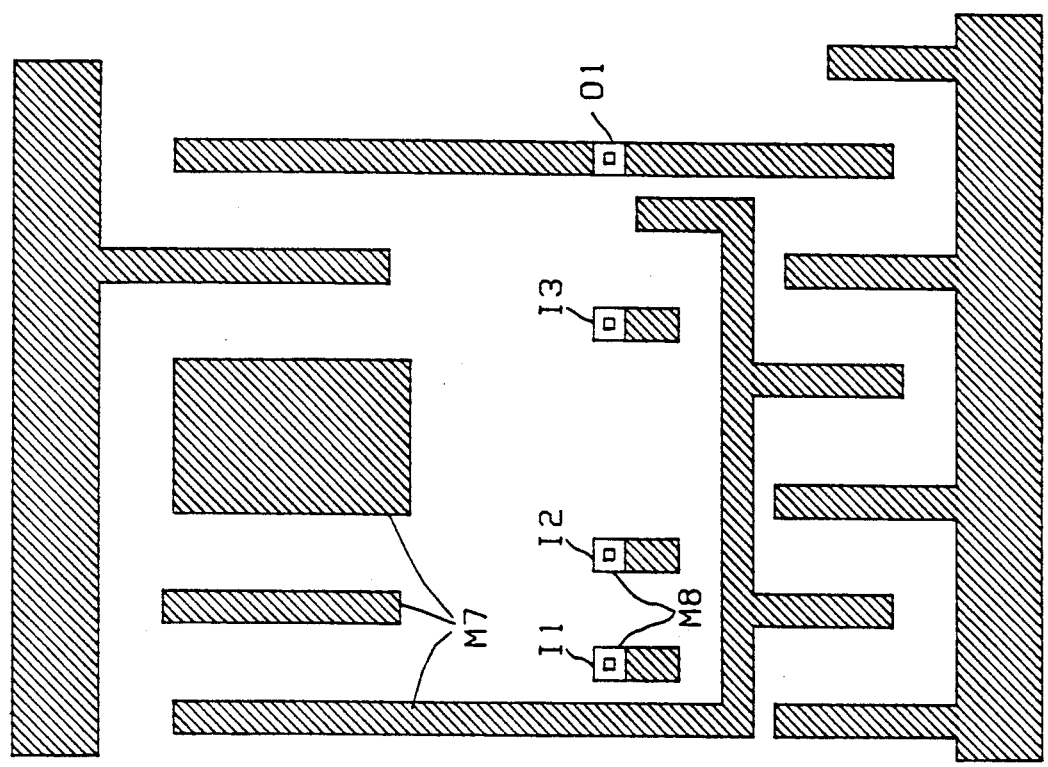
FIG. 10 shows a set of masks for the upper layers of one fast change logic cell which cause the cell to perform a three-input OR function.
Figure 9:
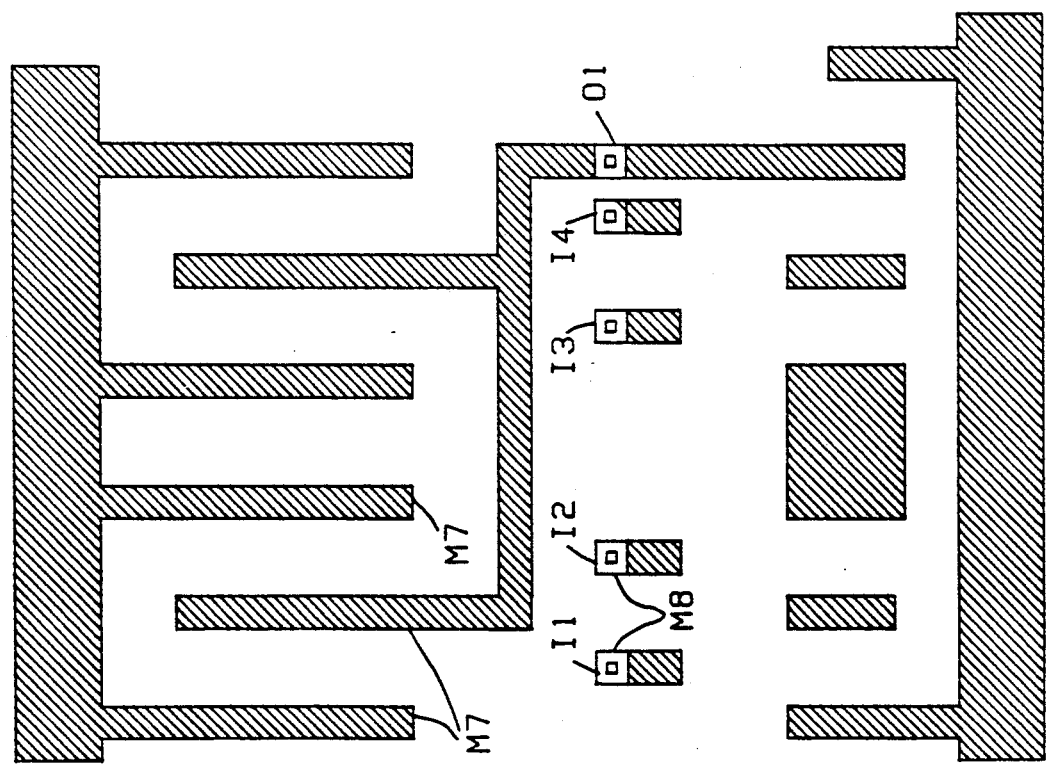
FIG. 9 is a set of masks for the upper layers of one fast change logic cell which cause the cell to perform a four-input NAND function.

To make a three-input AND gate from the fast change logic cell, the masks M7 and M8 of FIG. 7 are used. To make four separate inverters from the fast change logic cell, the masks M7 and M8 of FIG. 8 are used. To make a four-input NAND gate from the fast change logic cell, the masks M7 and M8 of FIG. 9 are used. And to make a three-input OR gate from the fast change logic cell, the masks M7 and M8 of FIG. 10 are used. In all of these FIGS. 7–10, the symbol I indicates a gate input and the symbol O indicates an output.

By changing the shape of the masks #7, #8, and #9, the transistors of the fast change logic cell can be interconnected to perform essentially any logic function. This is important because when a prototype machine is being made for checkout, it cannot be predicted what types of logic errors will be found. Since the fast change logic cells are so versatile, the number of them which needs to be inserted into the rows to correct a logic error is very small. Preferably, they occupy less than 5% of the space that is occupied by the standard logic cells. This is insignificant in comparison to the space that would be required to build spare standard logic cells of every type into the rows just in case their respective logic functions were needed to correct a logic error.

A preferred embodiment of the invention has now been described in detail. In addition, however, many changes and modifications can be made to this embodiment without departing from the spirit and nature of the invention.

For example, the number of transistors in each fast change logic cell is not limited to eight as is shown in FIGS. 3 and 4. More transistors can be added to each fast change logic cell in order to increase the complexity of the logic functions which the fast change cells perform.

Alternatively, two or more fast change logic cells as shown in FIGS. 3 and 4 can be disposed side by side in the rows on the chip, and the transistors of these concatenated cells can be selectively interconnected. An example of this is shown in FIGS. 11A, 11B, and 11C.

Figure 11A:
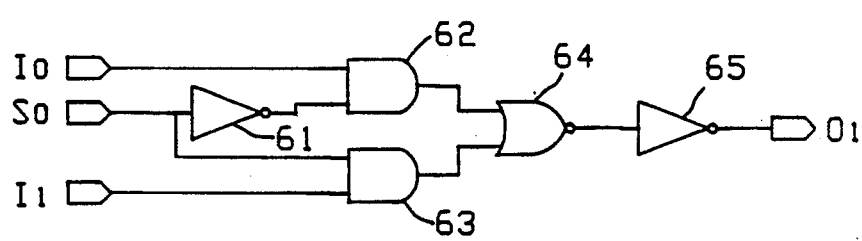
FIG. 11A is a logic drawing of a multiplexer.
Figure 11B:
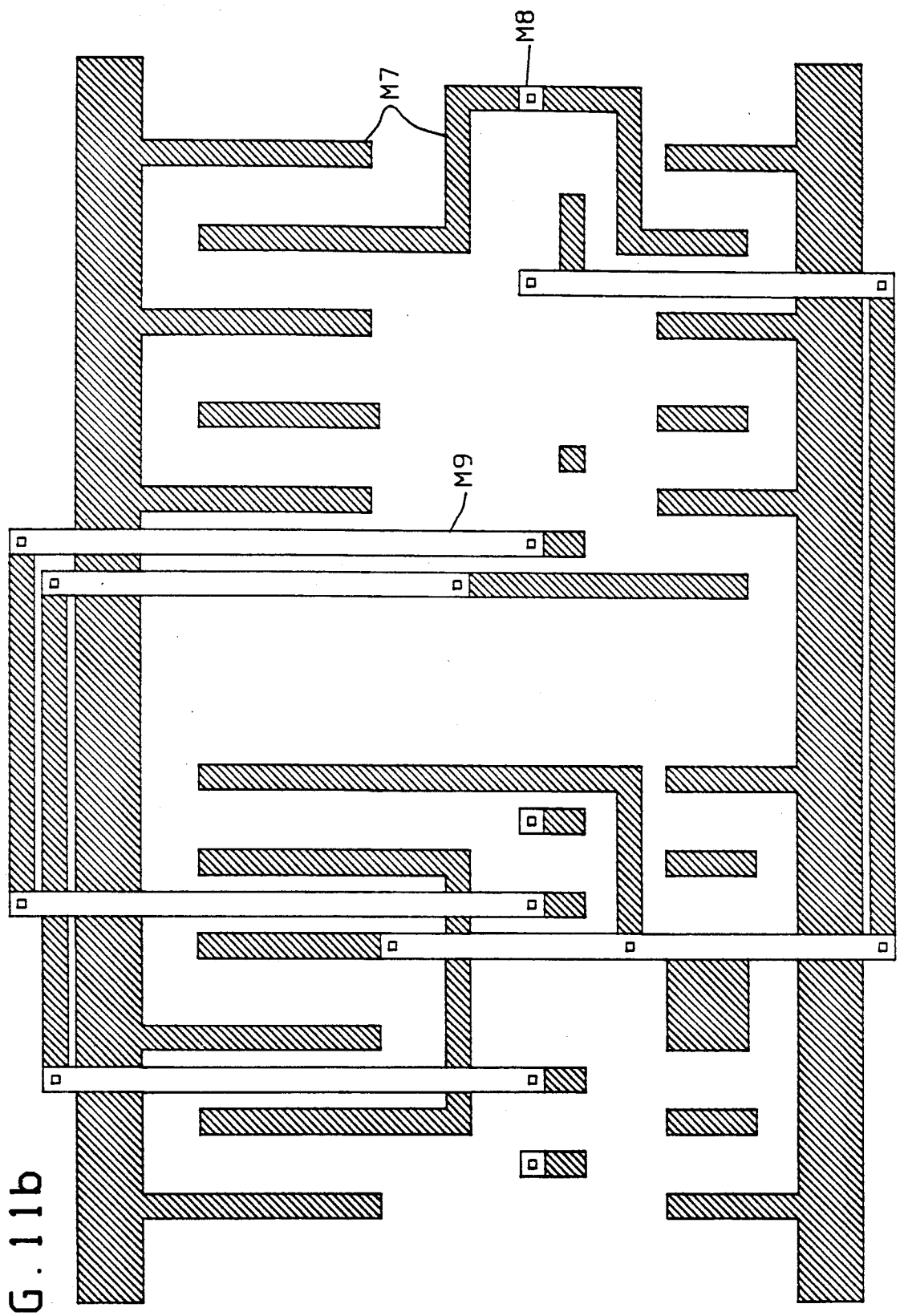
FIG. 11B is a set of masks for the upper layers of two adjacent fast change logic cells which cause them to implement the multiplexer of FIG. 11A.
Figure 11C:
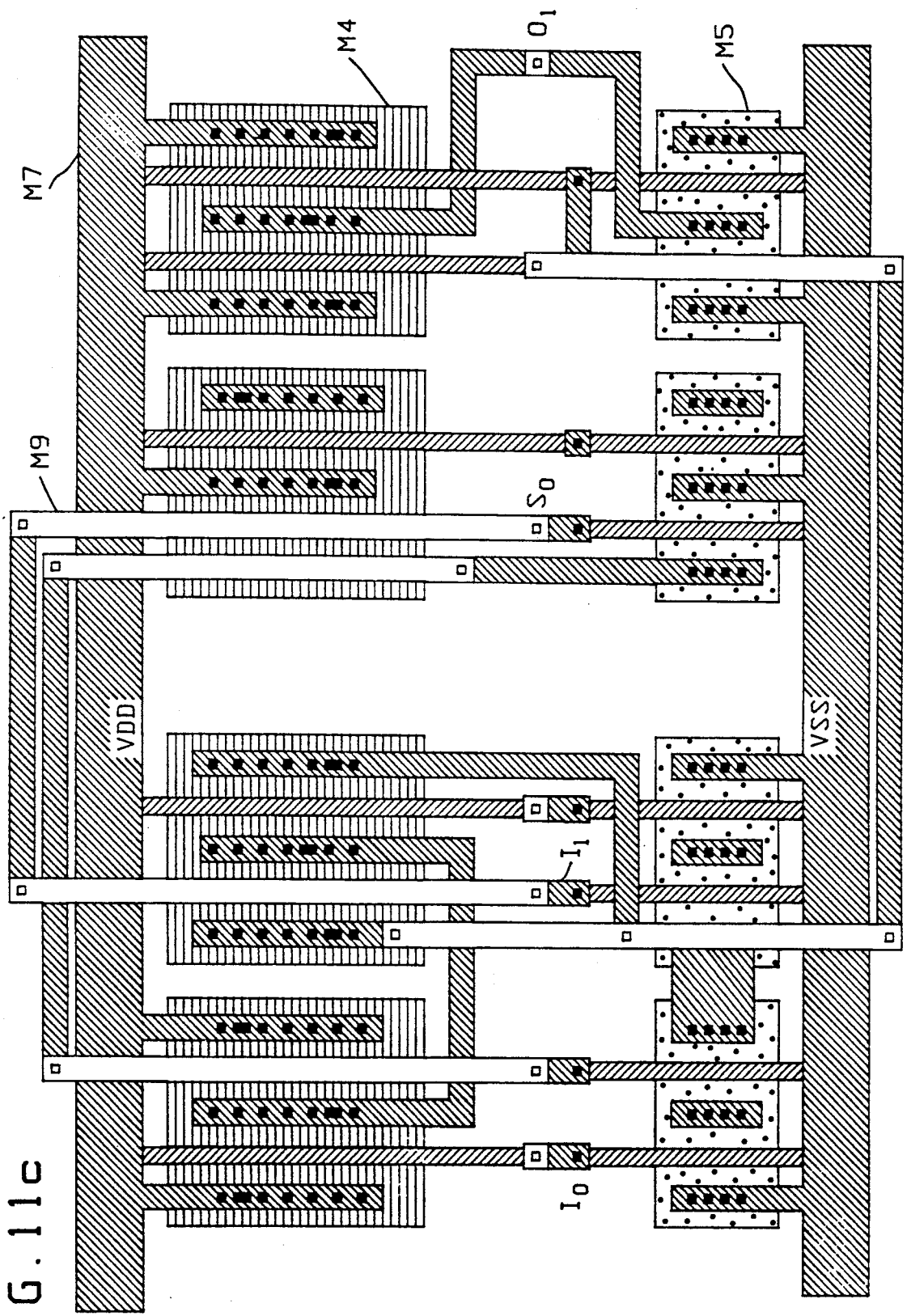
FIG. 11C is a composite drawing of FIG. 11B superimposed on two adjacent fast change cells of FIG. 3.

FIG. 11A is a logic diagram of a two-input multiplexer which is comprised of several logic gates 61-65. To implement this multiplexer, two concatenated fast change logic cells of FIGS. 3 and 4 can be used, and this is shown in FIGS. 11B and 11C. FIG. 11B shows the three masks M7, M8 and M9 which respectively pattern, the first layer metal, the contact holes to the first layer metal, and the second layer metal as given by Table 1. FIG. 11C is a composite drawing in which FIG. 11B is superimposed on top of two adjacent cells of FIG. 3.

As another modification, the layers in the fast change cells which have the same identical pattern are not limited to the layers 30-37 of FIG. 2. Preferably, however, such layers at least include all conductive and insulative layers in the fast change cells which are below the mid level of the stack of layers.

Accordingly, it is to be understood that the invention is not limited to the above described details but is defined by the appended claims

What is claimed is:

1. An improved standard cell logic chip of the type which includes hundreds of standard logic cells that are disposed in rows on said chip, and cell interconnect channels of different widths between said rows; said standard logic cells consisting of multiple conductive and insulative layers which are arranged in a stack; and, each of said layers having respective irregular shaped patterns which differ from one standard logic cell to another based on a logic function which the standard logic cell performs; wherein to accommodate a logic change quickly on said chip, the improvement comprises:
   several fast change logic cells which are sparsely distributed in said rows and which each selectively perform any one of several logic functions;
   each fast change logic cell being formed of the same stacked layers as said standard logic cells but which are patterned differently therefrom;
   all conductive and insulative layers in said fast change cells which are below at least the mid level in said stack of layers having respective patterns which are identical in every fast change cell; and,
   all remaining conductive and insulative layers in said fast change cells having respective patterns which differ from one fast change cell to another and select the logical functions which the fast change cells perform.

2. An improved standard cell logic chip according to claim 1 wherein said conductive and insulative layers below said predetermined level form N-channel and P-channel transistors with common gates regardless of the functions that the fast change cell performs.

3. An improved standard cell logic chip according to claim 2 wherein said conductive and insulative layers below predetermined level total at least ten in number and said remaining upper level layers are less than half thereof.

4. An improved standard cell logic chip according to claim 3 wherein said conductive and insulative layers below said predetermined level include P-doped source and drain regions in said substrate and said remaining upper layers serially interconnect said regions to perform a multi-input NAND or AND function.

5. An improved standard cell logic chip according to claim 3 wherein said conductive and insulative layers below said predetermined level include N-doped source and drain regions in said substrate and said upper layers serially interconnect said regions to perform a multi-input NOR or OR function.

6. An improved standard cell integrated chip of the type which includes a semiconductor substrate and a plurality of standard logic cells that are integrated into said substrate; each standard cell consisting of a respective number of transistors, all of which are interconnected within the cell and together perform a predetermined logic function; wherein to quickly accommodate a logic change on said chip, the improvement comprises:
   several fast change logic cells which are substantially smaller in number than the number of standard logic cells and are integrated into said substrate and selectively perform multiple logic functions;
   each of said fast change cells having the same number of transistors regardless of the functions that it performs; and,
   conductors, that overlie the fast change cell transistors, and select which logic functions are performed in a fast change cell by selectively interconnecting just those transistors in the fast change cell that are needed to perform the selected functions.

7. An improved standard cell integrated circuit chip according to claim 6 wherein said plurality of standard logic cells occupy a first area on said chip, and said fast change cells occupy a second area which is less than 5% of said first area.

8. An improved standard cell integrated circuit chip according to claim 6 wherein said transistors in said fast change logic cells include N-channel and P-channel transistors with common gates regardless of the functions that the cell performs.

9. An improved standard cell integrated circuit chip according to claim 6 wherein said multiple logic functions which said fast change cells perform include NAND, NOR, AND, and OR functions.

10. An improved standard cell integrated circuit chip according to claim 6 wherein said fast change logic cells include P-channel transistors with P-doped source and drain regions in said substrate which are serially interconnected by said conductors.

11. An improved standard cell integrated circuit chip according to claim 6 wherein said fast change logic cells include N-channel transistors with N-doped source and drain regions in said substrate which are serially interconnected by said conductors.

* * * * *